(12) United States Patent
Pang et al.

(10) Patent No.: US 6,346,825 B1
(45) Date of Patent: Feb. 12, 2002

(54) BLOCK RAM WITH CONFIGURABLE DATA WIDTH AND PARITY FOR USE IN A FIELD PROGRAMMABLE GATE ARRAY

(75) Inventors: Raymond C. Pang, San Jose, CA (US); Steven P. Young, Boulder, CO (US); Trevor J. Bauer, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/680,205

(22) Filed: Oct. 6, 2000

(51) Int. Cl.[7] .................. H03K 19/177; G06F 13/00
(52) U.S. Cl. .................. 326/40; 326/46; 711/104
(58) Field of Search .................. 326/37, 39, 40, 326/46; 711/104

(56) References Cited

U.S. PATENT DOCUMENTS

| | | | |
|---|---|---|---|
| 5,043,943 A | * 8/1991 | Crisp et al | 365/189.01 |
| 5,457,408 A | * 10/1995 | Leung | 326/38 |
| 5,933,023 A | 8/1999 | Young | |
| 6,181,164 B1 | * 1/2001 | Miller | 326/46 |

\* cited by examiner

*Primary Examiner*—Michael Tokar
*Assistant Examiner*—James H Cho
(74) *Attorney, Agent, or Firm*—Edel M. Young; E. Eric Hoffman, Esq.

(57) ABSTRACT

A dedicated block random access memory (RAM) is provided for a programmable logic device (PLD), such as a field programmable gate array (FPGA). The block RAM includes a memory cell array and control logic that is configurable to select one of a plurality of parity or non-parity modes for accessing the memory cell array. In one embodiment, the non-parity modes include a 1×16384 mode, a 2×8192 mode, and a 4×4096 mode, while the parity modes include a 9×2048 mode, a 18×1024 mode and an 36×512 mode. The control logic selects the parity/non-parity mode in response to configuration bits stored in corresponding configuration memory cells of the PLD. The configuration bits are programmed during configuration of the PLD. In one variation, the control logic selects the parity/non-parity mode in response to user signals. In a particular embodiment, the block RAM is a dual-port memory having a first port and a second port. In this embodiment, the first and second ports can be independently configured to have different (or the same) parity or non-parity modes.

23 Claims, 12 Drawing Sheets

| WORD WIDTH | DEPTH | 1ST PORT ADDRESS | 1ST PORT INPUT DATA | 1ST PORT OUTPUT DATA | 2ND PORT ADDRESS | 2ND PORT INPUT DATA | 2ND PORT OUTPUT DATA |
|---|---|---|---|---|---|---|---|
| 1 | 16384 | ADDR_A[13:0] | DIN_A[0] | DOUT_A[0] | ADDR_B[13:0] | DIN_B[0] | DOUT_B[0] |
| 2 | 8192 | ADDR_A[13:1] | DIN_A[1:0] | DOUT_A[1:0] | ADDR_B[13:1] | DIN_B[1:0] | DOUT_B[1:0] |
| 4 | 4096 | ADDR_A[13:2] | DIN_A[3:0] | DOUT_A[3:0] | ADDR_B[13:2] | DIN_B[3:0] | DOUT_B[3:0] |
| 9 | 2048 | ADDR_A[13:3] | DIN_A[7:0] PIN_A[0] | DOUT_A[7:0] POUT_A[0] | ADDR_B[13:3] | DIN_B[7:0] PIN_B[0] | DOUT_B[7:0] POUT_B[0] |
| 18 | 1024 | ADDR_A[13:4] | DIN_A[15:0] PIN_A[1:0] | DOUT_A[15:0] POUT_A[1:0] | ADDR_B[13:4] | DIN_B[15:0] PIN_B[1:0] | DOUT_B[15:0] POUT_B[1:0] |
| 36 | 512 | ADDR_A[13:5] | DIN_A[31:0] PIN_A[3:0] | DOUT_A[31:0] POUT_A[3:0] | ADDR_B[13:5] | DIN_B[31:0] PIN_B[3:0] | DOUT_B[31:0] POUT_B[3:0] |

FIG. 5

| WORD WIDTH | PORT_A [2:0] | FUNCTION OF ADDR_A[4:0] |
|---|---|---|
| 1 | 000 | ADDR_A[4:0] USED TO SELECT ONE OF THIRTY-TWO 1-BIT DATA VALUES (4 PARITY BITS ARE NOT USED) |
| 2 | 001 | ADDR_A[4:1] USED TO SELECT ONE OF SIXTEEN 2-BIT DATA VALUES (4 PARITY BITS ARE NOT USED) |
| 4 | 010 | ADDR_A[4:2] USED TO SELECT ONE OF EIGHT 4-BIT DATA VALUES (4 PARITY BITS ARE NOT USED) |
| 9 | 011 | ADDR_A[4:3] USED TO SELECT ONE OF FOUR 8-BIT DATA VALUES AND ONE OF FOUR PARITY VALUES |
| 18 | 100 | ADDR_A[4] USED TO SELECT ONE OF TWO 16-BIT DATA VALUES AND TWO OF FOUR PARITY VALUES |
| 36 | 101 | ADDR_A[4:0] IS NOT USED; MUX 602A PASSES ALL RECEIVED BITS AS ONE 32-BIT DATA VALUE AND FOUR PARITY VALUES |

FIG. 7

| PORT_A | 000 | 001 | 010 | 011 | 100 | 101 |
|---|---|---|---|---|---|---|
| D_A[0] | DIN_A[0] | DIN_A[0] | DIN_A[0] | DIN_A[0] | DIN_A[0] | DIN_A[0] |
| D_A[1] | DIN_A[0] | DIN_A[1] | DIN_A[1] | DIN_A[1] | DIN_A[1] | DIN_A[1] |
| D_A[2] | DIN_A[0] | DIN_A[0] | DIN_A[2] | DIN_A[2] | DIN_A[2] | DIN_A[2] |
| D_A[3] | DIN_A[0] | DIN_A[1] | DIN_A[3] | DIN_A[3] | DIN_A[3] | DIN_A[3] |
| D_A[4] | DIN_A[0] | DIN_A[0] | DIN_A[0] | DIN_A[4] | DIN_A[4] | DIN_A[4] |
| D_A[5] | DIN_A[0] | DIN_A[1] | DIN_A[1] | DIN_A[5] | DIN_A[5] | DIN_A[5] |
| D_A[6] | DIN_A[0] | DIN_A[0] | DIN_A[2] | DIN_A[6] | DIN_A[6] | DIN_A[6] |
| D_A[7] | DIN_A[0] | DIN_A[1] | DIN_A[3] | DIN_A[7] | DIN_A[7] | DIN_A[7] |
| D_A[8] | DIN_A[0] | DIN_A[0] | DIN_A[0] | DIN_A[0] | DIN_A[8] | DIN_A[8] |
| D_A[9] | DIN_A[0] | DIN_A[1] | DIN_A[1] | DIN_A[1] | DIN_A[9] | DIN_A[9] |
| D_A[10] | DIN_A[0] | DIN_A[0] | DIN_A[2] | DIN_A[2] | DIN_A[10] | DIN_A[10] |
| D_A[11] | DIN_A[0] | DIN_A[1] | DIN_A[3] | DIN_A[3] | DIN_A[11] | DIN_A[11] |
| D_A[12] | DIN_A[0] | DIN_A[0] | DIN_A[0] | DIN_A[4] | DIN_A[12] | DIN_A[12] |
| D_A[13] | DIN_A[0] | DIN_A[1] | DIN_A[1] | DIN_A[5] | DIN_A[13] | DIN_A[13] |
| D_A[14] | DIN_A[0] | DIN_A[0] | DIN_A[2] | DIN_A[6] | DIN_A[14] | DIN_A[14] |
| D_A[15] | DIN_A[0] | DIN_A[1] | DIN_A[3] | DIN_A[7] | DIN_A[15] | DIN_A[15] |
| D_A[16] | DIN_A[0] | DIN_A[0] | DIN_A[0] | DIN_A[0] | DIN_A[0] | DIN_A[16] |
| D_A[17] | DIN_A[0] | DIN_A[1] | DIN_A[1] | DIN_A[1] | DIN_A[1] | DIN_A[17] |
| D_A[18] | DIN_A[0] | DIN_A[0] | DIN_A[2] | DIN_A[2] | DIN_A[2] | DIN_A[18] |
| D_A[19] | DIN_A[0] | DIN_A[1] | DIN_A[3] | DIN_A[3] | DIN_A[3] | DIN_A[19] |
| D_A[20] | DIN_A[0] | DIN_A[0] | DIN_A[0] | DIN_A[4] | DIN_A[4] | DIN_A[20] |
| D_A[21] | DIN_A[0] | DIN_A[1] | DIN_A[1] | DIN_A[5] | DIN_A[5] | DIN_A[21] |
| D_A[22] | DIN_A[0] | DIN_A[0] | DIN_A[2] | DIN_A[6] | DIN_A[6] | DIN_A[22] |
| D_A[23] | DIN_A[0] | DIN_A[1] | DIN_A[3] | DIN_A[7] | DIN_A[7] | DIN_A[23] |
| D_A[24] | DIN_A[0] | DIN_A[0] | DIN_A[0] | DIN_A[0] | DIN_A[8] | DIN_A[24] |
| D_A[25] | DIN_A[0] | DIN_A[1] | DIN_A[1] | DIN_A[1] | DIN_A[9] | DIN_A[25] |
| D_A[26] | DIN_A[0] | DIN_A[0] | DIN_A[2] | DIN_A[2] | DIN_A[10] | DIN_A[26] |
| D_A[27] | DIN_A[0] | DIN_A[1] | DIN_A[3] | DIN_A[3] | DIN_A[11] | DIN_A[27] |
| D_A[28] | DIN_A[0] | DIN_A[0] | DIN_A[0] | DIN_A[4] | DIN_A[12] | DIN_A[28] |
| D_A[29] | DIN_A[0] | DIN_A[1] | DIN_A[1] | DIN_A[5] | DIN_A[13] | DIN_A[29] |
| D_A[30] | DIN_A[0] | DIN_A[0] | DIN_A[2] | DIN_A[6] | DIN_A[14] | DIN_A[30] |
| D_A[31] | DIN_A[0] | DIN_A[1] | DIN_A[3] | DIN_A[7] | DIN_A[15] | DIN_A[31] |
| D_A[32] | DIN_A[0] | DIN_A[0] | DIN_A[0] | PIN_A[0] | PIN_A[0] | PIN_A[0] |
| D_A[33] | DIN_A[0] | DIN_A[1] | DIN_A[1] | PIN_A[0] | PIN_A[1] | PIN_A[1] |
| D_A[34] | DIN_A[0] | DIN_A[0] | DIN_A[2] | PIN_A[0] | PIN_A[0] | PIN_A[2] |
| D_A[35] | DIN_A[0] | DIN_A[1] | DIN_A[3] | PIN_A[0] | PIN_A[1] | PIN_A[3] |

FIG. 10

| PORT_A= | 000 | 001 | 010 | 011 | 100 | 101 |
|---|---|---|---|---|---|---|
| ADDR[4:0]= | 00101 | 0011X | 000XX | 10XXX | 0XXXX | XXXXX |
| WSEL_A[0] | 0 | 0 | 1 | 0 | 1 | 1 |
| WSEL_A[1] | 0 | 0 | 1 | 0 | 1 | 1 |
| WSEL_A[2] | 0 | 0 | 1 | 0 | 1 | 1 |
| WSEL_A[3] | 0 | 0 | 1 | 0 | 1 | 1 |
| WSEL_A[4] | 0 | 0 | 0 | 0 | 1 | 1 |
| WSEL_A[5] | 1 | 0 | 0 | 0 | 1 | 1 |
| WSEL_A[6] | 0 | 1 | 0 | 0 | 1 | 1 |
| WSEL_A[7] | 0 | 1 | 0 | 0 | 1 | 1 |
| WSEL_A[8] | 0 | 0 | 0 | 0 | 1 | 1 |
| WSEL_A[9] | 0 | 0 | 0 | 0 | 1 | 1 |
| WSEL_A[10] | 0 | 0 | 0 | 0 | 1 | 1 |
| WSEL_A[11] | 0 | 0 | 0 | 0 | 1 | 1 |
| WSEL_A[12] | 0 | 0 | 0 | 0 | 1 | 1 |
| WSEL_A[13] | 0 | 0 | 0 | 0 | 1 | 1 |
| WSEL_A[14] | 0 | 0 | 0 | 0 | 1 | 1 |
| WSEL_A[15] | 0 | 0 | 0 | 0 | 1 | 1 |
| WSEL_A[16] | 0 | 0 | 0 | 1 | 0 | 1 |
| WSEL_A[17] | 0 | 0 | 0 | 1 | 0 | 1 |
| WSEL_A[18] | 0 | 0 | 0 | 1 | 0 | 1 |
| WSEL_A[19] | 0 | 0 | 0 | 1 | 0 | 1 |
| WSEL_A[20] | 0 | 0 | 0 | 1 | 0 | 1 |
| WSEL_A[21] | 0 | 0 | 0 | 1 | 0 | 1 |
| WSEL_A[22] | 0 | 0 | 0 | 1 | 0 | 1 |
| WSEL_A[23] | 0 | 0 | 0 | 1 | 0 | 1 |
| WSEL_A[24] | 0 | 0 | 0 | 0 | 0 | 1 |
| WSEL_A[25] | 0 | 0 | 0 | 0 | 0 | 1 |
| WSEL_A[26] | 0 | 0 | 0 | 0 | 0 | 1 |
| WSEL_A[27] | 0 | 0 | 0 | 0 | 0 | 1 |
| WSEL_A[28] | 0 | 0 | 0 | 0 | 0 | 1 |
| WSEL_A[29] | 0 | 0 | 0 | 0 | 0 | 1 |
| WSEL_A[30] | 0 | 0 | 0 | 0 | 0 | 1 |
| WSEL_A[31] | 0 | 0 | 0 | 0 | 0 | 1 |
| WSEL_A[32] | 0 | 0 | 0 | 0 | 1 | 1 |
| WSEL_A[33] | 0 | 0 | 0 | 0 | 1 | 1 |
| WSEL_A[34] | 0 | 0 | 0 | 1 | 0 | 1 |
| WSEL_A[35] | 0 | 0 | 0 | 0 | 0 | 1 |

FIG. 11

BLOCK RAM WITH CONFIGURABLE DATA WIDTH AND PARITY FOR USE IN A FIELD PROGRAMMABLE GATE ARRAY

FIELD OF THE INVENTION

The present invention relates to dedicated block random access memory (RAM) located on a programmable logic device, such as a field programmable gate array (FPGA).

RELATED ART

FPGAs typically include an array of configurable logic blocks (CLBs), input/output blocks (IOBs) and programmable interconnect circuitry that extends between the CLBs and IOBs. Some FPGAs include dedicated columns of block RAM which are located between columns of the CLBs. Such block RAM provides a relatively high-density memory. In the absence of the block RAM, memory could be provided by configuring the CLBs in an appropriate manner. However, a relatively large number of CLBs are required to provide a small memory, thereby resulting in an inefficient use of FPGA resources. An FPGA that includes block RAM is described in U.S. Pat. No. 5,933,023.

The block RAMs present in the above-identified FPGAs are not capable of storing data values with parity bits. Thus, the block RAMs of conventional FPGAs have been undesirably limited to a non-parity configuration. Providing for parity configurations when word width is fairly large would advantageously provide the user with more flexibility to suit their application needs.

It would therefore be desirable to have a dual-port block RAM with selectable parity and non-parity configurations.

SUMMARY

Accordingly, the present invention provides an FPGA that includes a block RAM having selectable parity and non-parity configurations. The block RAM includes a memory cell array and control logic that is configurable to select one of a plurality of parity and non-parity configurations for storing data in the memory cell array. In one embodiment, the block RAM includes a 144 column×128 row array of dual-port memory cells. One embodiment of the array allows for word lengths (data widths) of 1, 2, 4, 9, 18, and 36 bits. The 9, 18, and 36-bit words allow for convenient addition of 1, 2, and 4 parity bits, respectively, if desired by the user and also allow for 8, 16, and 32-bit words if the user does not choose to use parity. Yet with no use of parity, a rather small amount of memory goes unused.

The present invention treats the 18-bit unit as two blocks of RAM, a 16-bit block and a 2-bit block and allows particularly efficient use of all the memory bits. When the RAM is being configured in a shallow configuration 1 or 2 bits wide, access is granted to the shallower (2-bit) blocks, thus making full use of the memory space.

The control logic selects the parity/non-parity configurations in response to configuration bits stored in corresponding configuration memory cells of the FPGA. The configuration bits are typically programmed during configuration of the PLD.

In a particular embodiment, the block RAM is a dual-port memory having a first port and a second port. In this embodiment, the first and second ports can be independently configured to have different (or the same) parity/non-parity configurations. The widths of the first and second ports can also be independently configured.

Mapping data between ports of different data widths becomes non-trivial when the parity block is added. The invention allows the memory array to be operated at widths that are multiples of 9 bits and allows both parity and non-parity modes to be efficiently used (see FIGS. 8–11).

The present invention will be more fully understood in view of the following description and drawings.

BRIEF DESCRIPTION OF THE DRAWINGS

FIG. 5 is a table that summarizes the signals used in the six possible configurations of the block RAM of FIG. 4.

FIG. 7 is a table that defines the functionality of port configuration signals and address signals in a read path in accordance with one embodiment of the present invention.

FIG. 10 is a table that illustrates the manner in which a de-multiplexer routes input data and parity bits for six different configurations of the block RAM of FIG. 4 in accordance with one embodiment of the present invention.

FIG. 11 is a table that illustrates the manner in which an address decoder generates write enable signals in response to port configuration signals and address signals in accordance with one embodiment of the present invention.

DETAILED DESCRIPTION

Figure 1:
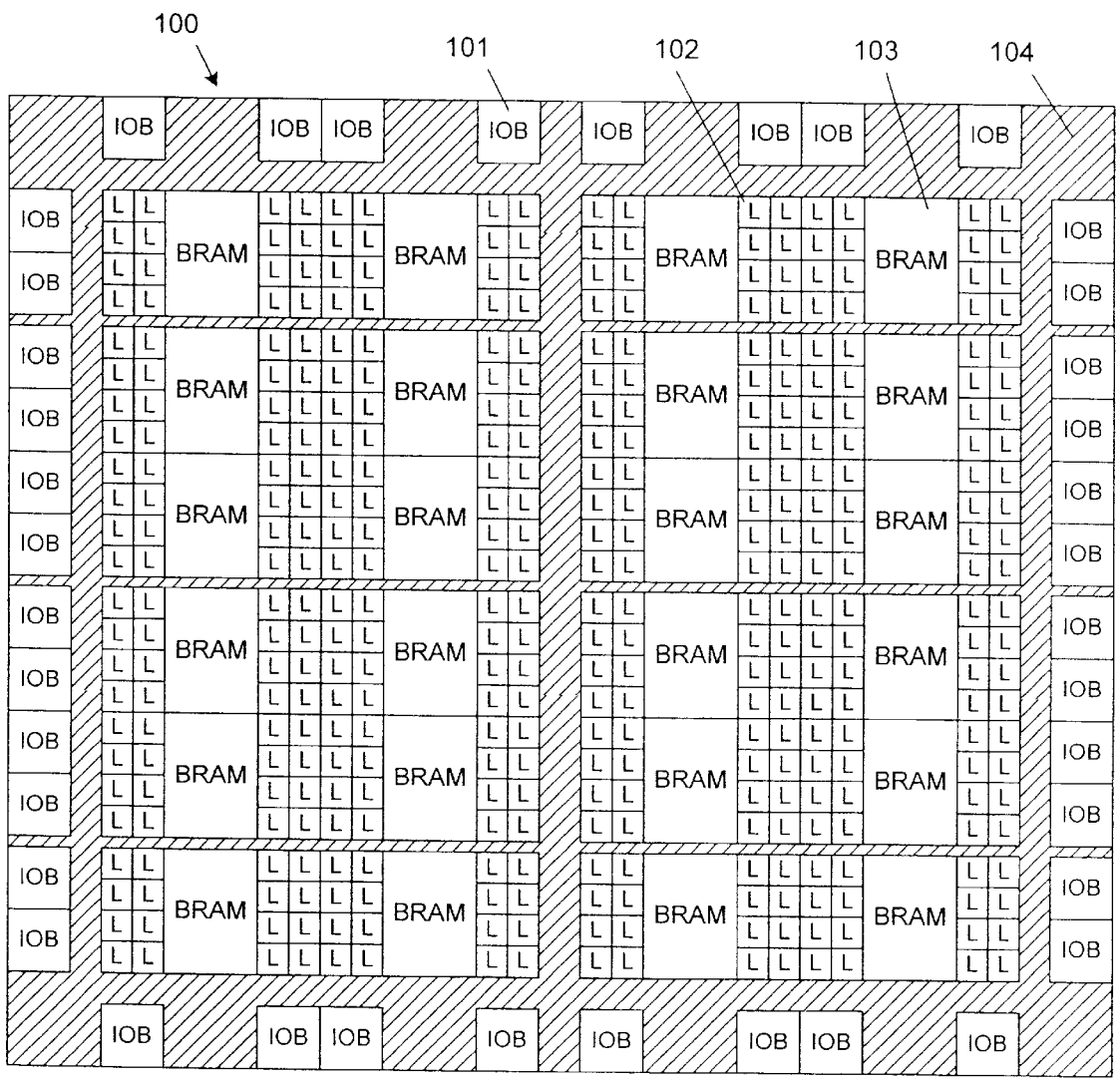
FIG. 1 is a block diagram of the general layout of IOBs, CLBs and block RAMs in accordance with one embodiment of the present invention.

FIG. 1 is a block diagram that illustrates the general layout of IOBs, CLBs and block RAMs and general interconnect circuitry of a field programmable gate array (FPGA) 100 in accordance with one embodiment of the present invention. IOBs, such as IOB 101, are located around the perimeter of the FPGA and are labeled with the letters "IOB". CLBs, such as CLB 102, are labeled with the letter "L". Block RAMS, such as block RAM 103, are labeled with the letters "BRAM". General programmable interconnect circuitry 104 is provided to programmably connect the IOBs, CLBS, block RAMs and configuration circuitry. In the described embodiments, each of the block RAms has a height equal to the height of four CLBs. In other embodiments, the block RAMs can have other heights. The block RAMs are arranged in columns which extend the height of the CLB array. In addition, each block RAM column is separated from an adjacent block RAM column by a plurality of columns of CLBs. This ensures that a significant and regular amount of logic resources exist between adjacent block RAM columns. Although a particular layout is illustrated, it is understood that many other layouts are possible, and are considered to fall within the scope of the present invention. For example, other embodiments can have other numbers of IOBs, CLBs and block RAMS.

Figure 2:
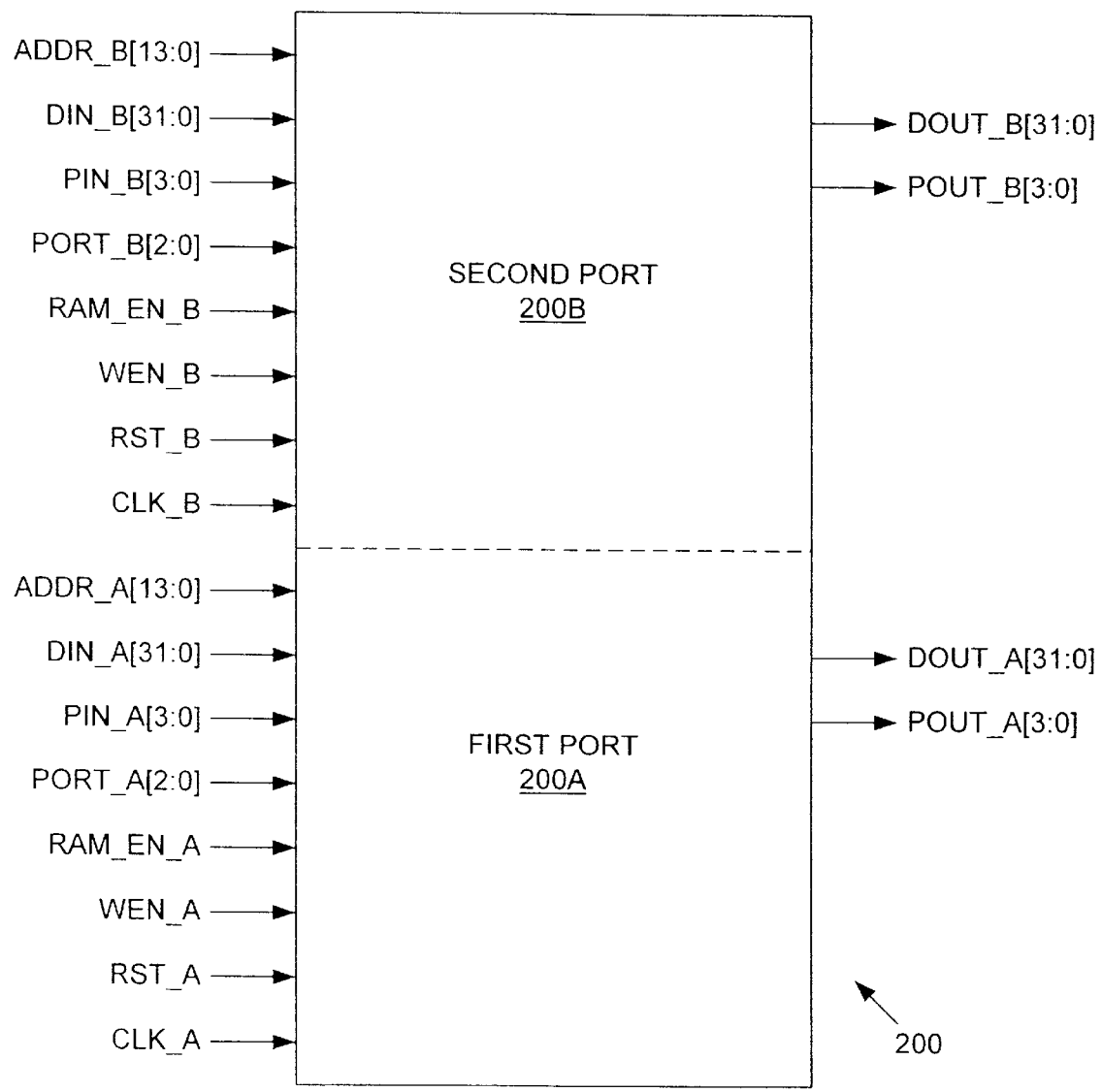
FIG. 2 is a block diagram of a dual-port block RAM in accordance with one embodiment of the present invention.

FIG. 2 is a block diagram illustrating a dual-port block RAM 200 in accordance with one embodiment of the present invention. Dual-port block RAM 200 includes a first port 200A, which is shown at the lower portion of FIG. 2, and a second port 200B, which is shown at the upper half of FIG. 2. In the present embodiment, block RAM 200 includes an array of dual-port SRAM cells that are shared by both block RAM ports 200A and 200B. In the described embodiment, the array of dual-port SRAM cells includes 144 columns and 128 rows. The logical dimension of this array as seen by each block RAM port is configurable and can be configured independently of the other port. The first port 200A can be configured to access a logical array of PA bit line pairs (columns) and QA word lines (rows). The second port 200B can be configured to access a logical array of PB bit line pairs (columns) and QB word lines (rows). Table 1 lists possible values for PA, QA, PB and QB in accordance with the described embodiment of the invention.

TABLE 1

| PA/PB | QA/QB |
|---|---|
| 1 | 16384 |
| 2 | 8192 |
| 4 | 4096 |
| 9 | 2048 |
| 18 | 1024 |
| 36 | 512 |

The first port 200A includes terminals for receiving an input address signal ADDR_A[13:0], an input data signal DIN_A[31:0], an input parity signal PIN_A[3:0], a port configuration signal PORT_A[2:0], a first port enable signal RAM_EN_A, a first port write enable signal WEN_A, a first port reset signal RST_A and a first port clock signal CLK_A. The first port 200A also includes terminals for providing an output data signal DOUT_A[31:0] and an output parity signal POUT_A[3:0].

The second port 200B includes terminals for receiving an input address signal ADDR_B[13:0], an input data signal DIN_B[31:0], an input parity signal PIN_B[3:0], a port configuration signal PORT_B[2:0], a second port enable signal RAM_EN_B, a second port write enable signal WEN_B, a second port reset signal RST_B and a second port clock signal CLK_B. The second port 200B also includes terminals for providing an output data signal DOUT_B[31:0] and an output parity signal POUT_B[3:0].

In the described examples, the operation of the first port 200A is described. It is understood that the operation of the second port 200B is identical to, but independent of, the operation of the first port 200A.

Figure 3:
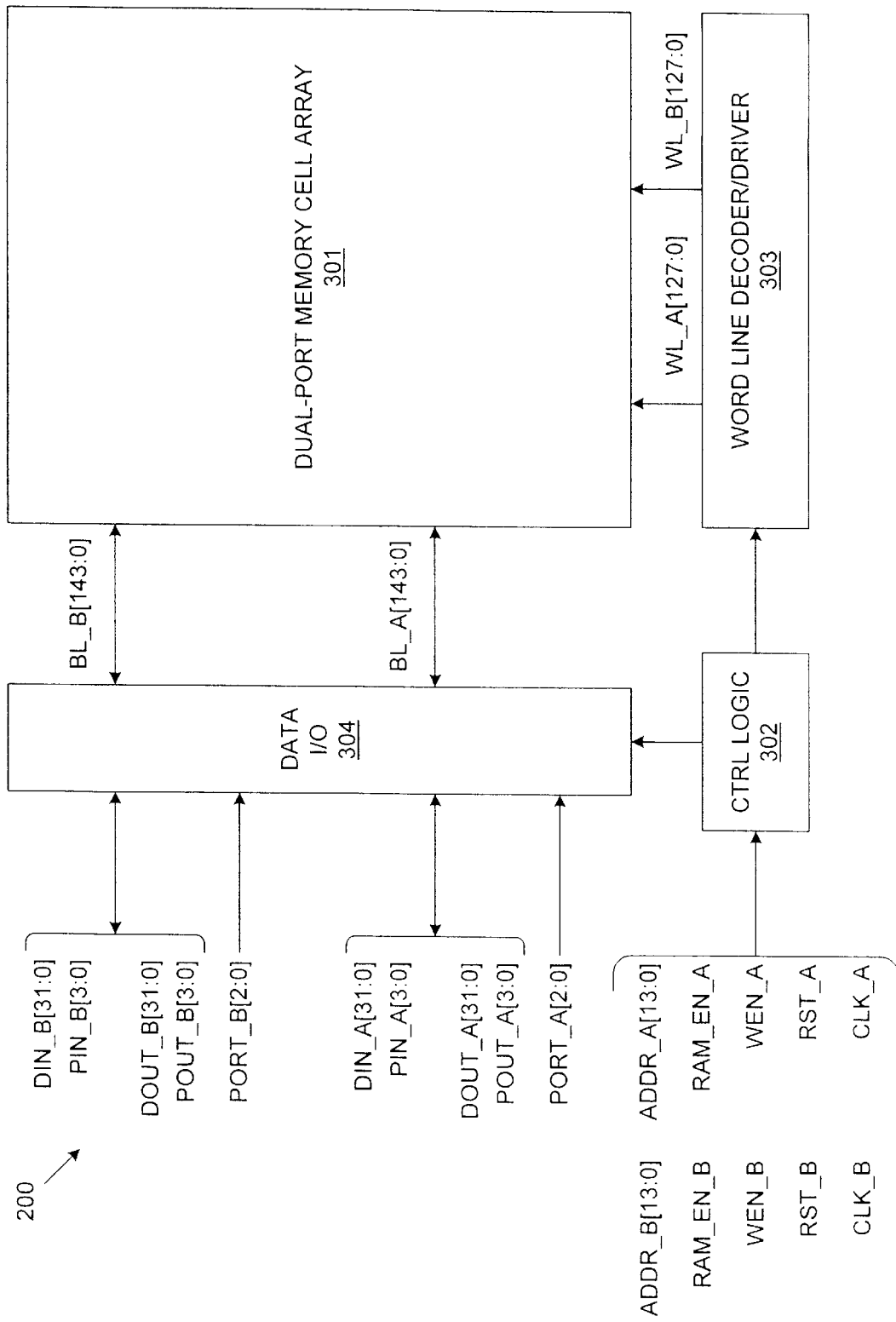
FIG. 3 is a block diagram showing the block RAM of FIG. 2 in more detail.

FIG. 3 is a block diagram illustrating a portion of block RAM 200 in greater detail. Block RAM 200 includes a dual-port memory cell array 301, control logic 302, word line decoder/driver circuit 303, and data input/output (I/O) circuit 304. Control logic 302 is coupled to receive the input signals ADDR_A[13:0], RAM_EN_A, WEN_A, RST_A and CLK_A for the first port, as well as the input signals ADDR_B[13:0], RAM_EN_B, WEN_B, RST_B and CLK_B for the second port.

First port word lines WL_A[127:0] and second port word lines WL_B[127:01] run vertically through memory cell array 301. The word lines WL_A[127:0] and WL_B[127:0] are controlled by word line decoder/driver 303.

First port bit line pairs BL_A[143:0] and second port bit line pairs BL_B[143:0] run horizontally through memory cell array 301. Bit line pairs BL_A[143:0] and BL_B[143:0] are coupled to data I/O circuit 304 as illustrated.

Data I/O circuit 304 routes the input data values DIN_A[31:0], PIN_A[3:0], DIN_B[31:0] and PIN_B[3:0] to memory cell array 301, and routes the output data values DOUT_A[31:0], POUT_A[3:0], DOUT_B[31:0] and POUT_B[3:0] from memory cell array 301 under the control of control logic 302 in the manner described below.

Figure 4:
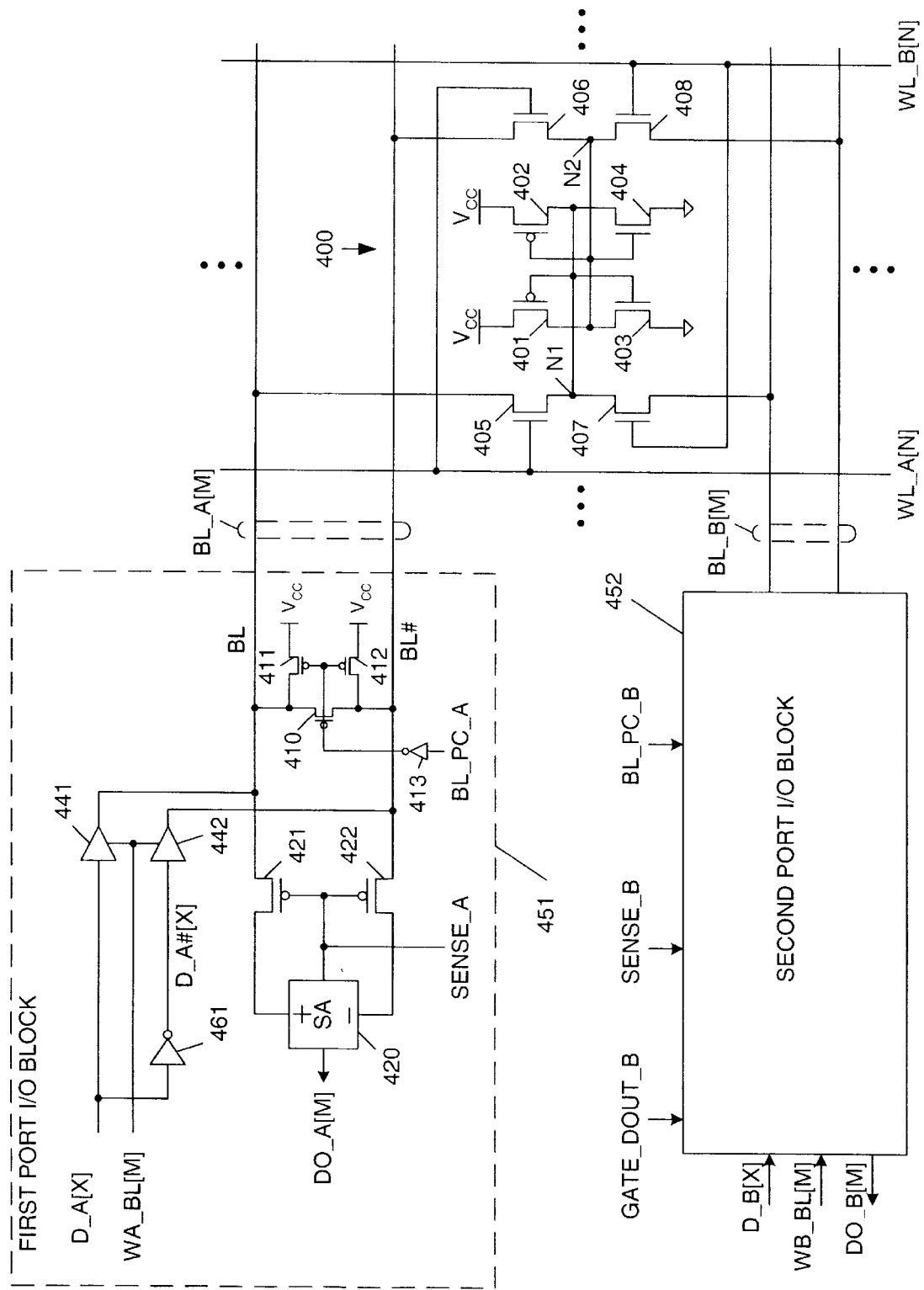
FIG. 4 is a circuit diagram of a dual-port SRAM memory cell and associated I/O circuitry in accordance with one embodiment of the present invention.

FIG. 4 is a circuit diagram of a dual-port SRAM memory cell 400 in memory cell array 301 and associated I/O blocks 451–452 in data I/O circuit 304. Each of the bit line pairs in memory cell array 301 is coupled to an associated I/O block in data I/O circuit 304. I/O block 451 is coupled to the bit lines of the first port of memory cell 400, and I/O block 452 is coupled to the bit lines of the second port of memory cell 400. Because I/O blocks 451 and 452 include identical circuitry, only I/O block 451 is described in detail. As illustrated by FIG. 4, I/O blocks 451 and 452 operate in response to similar signals.

Dual-port SRAM cell 400 includes p-channel pull-up transistors 401–402, n-channel pull-down transistors 403–404 and n-channel access transistors 405–408. Transistors 401–404 are configured to form a cross-coupled latch, which stores a logic high or logic low data value.

At the first port of SRAM cell 400, the drains of access transistors 405 and 406 are coupled to storage nodes N1 and N2, respectively. The gates of access transistors 405–406 are coupled to word line WL_A[N], where N is an integer between 0 and 127, inclusive. The sources of access transistors 405–406 are coupled to complementary bit line pair BL_A[M], where M is an integer between 0 and 143, inclusive.

At the second port of SRAM cell 400, the drains of access transistors 407 and 408 are coupled to storage nodes N1 and N2, respectively. The gates of access transistors 407–408 are coupled to word line WL_B[N]. The sources of access transistors 407–408 are coupled to complementary bit line pair BL_B[M].

First port I/O block 451 includes p-channel bit line equalization transistor 410, p-channel pre-charge transistors 411–412, inverter 413, p-channel bit line select transistors 421–422, sense amplifier 420, data latch 430, tri-state write buffers 441–442 and inverter 461.

Bit line equalization transistor 410 is connected across bit lines BL and BL# of the complementary bit line pair BL_A[M]. Pre-charge transistors 411 and 412 are connected between bit lines BL and BL#, respectively, and the $V_{CC}$ voltage supply terminal. The gates of transistors 410–412 are coupled to receive the inverse of a bit line pre-charge signal (BL_PC_A) from inverter 413. The bit line pre-charge signal BL_PC_A is provided by control logic 302 (FIG. 3).

Bit line select transistors 421 and 422 are connected in series with bit lines BL and BL#, respectively, of the complementary bit line pair BL_A[M]. The gates of bit line select transistors 421 and 422 are coupled to receive a sense amplifier enable signal (SENSE_A) provided by control logic 302 (FIG. 3).

Sense amplifier 420 is also coupled to receive the sense amplifier enable signal SENSE_A from control logic 302. When the SENSE_A signal is asserted high, sense amplifier 420 is enabled. Differential input terminals of sense amplifier 420 are coupled to bit lines BL and BL# of bit line pair BL_A[M] through select transistors 421–422. As described in more detail below, sense amplifier 420 provides an output signal (DO_A[M]) on its output terminal.

Sense amplifier 420 is coupled across bit lines BL and BL# of bit line pair BL_A[M]. As described in more detail below, four of the 144 DO_A[M] bits are dedicated to providing parity output bits POUT A[3:0] instead of data output bits.

Tri-state write data buffers 441–442 are coupled to receive the data input signal D_A[X] and the complement of the data input signal D_A#[X], where X is an integer between 0 and 35, inclusive. Inverter 461 provides the complementary data input signal D_A#[X] in response to the data input signal D_A[X]. Tri-state write data buffers 441–442 are enabled and disabled in response to a write control signal WA_BL[M] that is provided by control circuit 302.

Each port of block RAM 200 can be controlled to operate in one of three separate and programmable write modes, independently of the other port. One of the three write modes is selected by programming control logic 302 in the appropriate manner. These three write modes are: 1) a write with write-back mode; 2) a write without write-back mode; and 3) a read then write mode. These three write modes (and a read mode) are described in more detail in commonly owned, co-pending U.S. patent application Ser. No. 09/574,300 which is hereby incorporated by reference in its entirety.

In accordance with one embodiment of the present invention, dual-port block RAM 200 can be configured to operate as a 36×512 array, an 18×1024 array, a 9×2048 array, a 4×4096 array, a 2×8192 array, or 1×16384 array. The configured arrays that use data values with widths of 36, 18 and 9 bits include one or more parity bits per data value, while the configured arrays that use data values with widths of 4, 2 and 1 bits do not include any parity bits. Thus, block RAM 200 is configurable to create a memory array that implements parity bits, or a memory array that does not implement parity bits. This feature advantageously provides operating flexibility to the user of the FPGA.

FIG. 5 is a table that summarizes the signals used in the six possible configurations of block RAM 200. For example, when block RAM 200 is configured as a 9×2048 array, the first port 200A is accessed by address signals ADDR_A [13:3]. The 9-bit input data values are provided to the first port as signals DIN_A[7:0] (8 data bits) and PIN_A[0] (1 parity bit). The 9-bit output data values are provided at the first port as signals DOUT_A[7:0] (8 data bits) and POUT_A[0] (1 parity bit). Similar signals are provided at the second port 200B of the array.

Read Path

Figure 6:
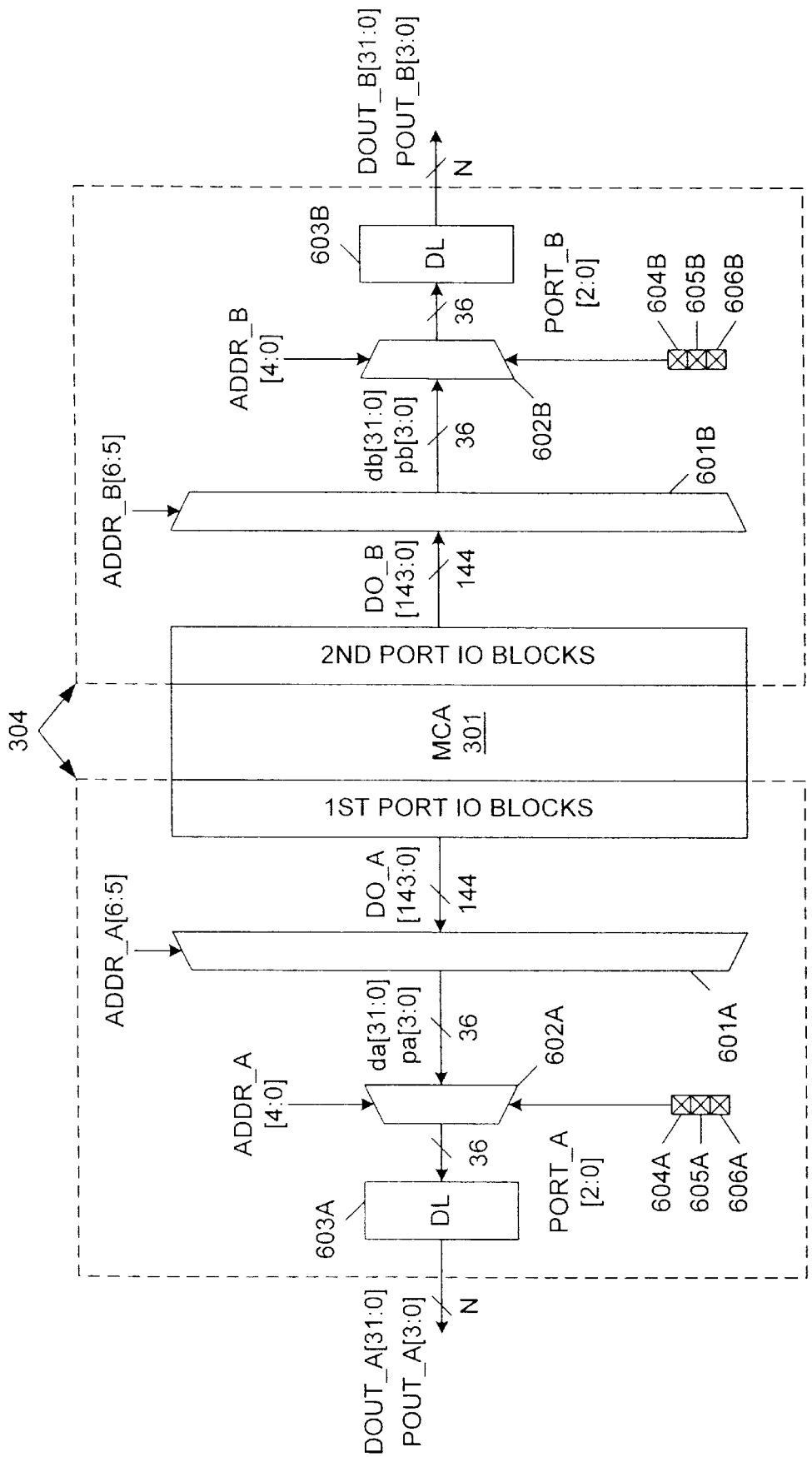
FIG. 6 is a block diagram illustrating the read paths of the first and second ports of the block RAM of FIG. 4 in accordance with one embodiment of the present invention.

FIG. 6 is a block diagram illustrating the read paths of the first and second ports of block RAM 200 within I/O circuit 304. The read path of the first port includes multiplexer 601A, multiplexer 602A and data latches 603A. The read path of the second port includes multiplexer 601B, multiplexer 602B and data latches 603B. Because these read paths are identical, only the read path of the first port is described in detail.

The output data signals DO_A[143:0] provided by the sense amplifiers of block RAM 200 (see FIG. 4) are provided to the input terminals of multiplexer 601A. Multiplexer 601A is configured to route the signals on one set of 36 bit lines in response to the address signals ADDR_A [6:5]. The 36-bits routed by multiplexer 601A are provided to input terminals of multiplexer 602A. These 36 bits include 32 data bits da[31:0] and 4 parity bits pa[3:0]. In the configurations that do not use parity bits, only 32 of the 36 data bits are used. Multiplexer 602A is configured to route 36 bits in response to the address signals ADDR_A[4:0] and port configuration signals PORT_A[2:0]. Port configuration signals PORT_A[2:0] are used to select one of the six possible configurations. In the described embodiment, the port configuration signals PORT_A[2:0] are stored in configuration memory cells 604A, 605A and 606A of FPGA 100. Similarly, the port configuration signals PORT_B[2:0] are stored in configuration memory cells 604B, 605B and 606B of FPGA 100. In one embodiment, these configuration memory cells are loaded with configuration bits during configuration of FPGA 100.

FIG. 7 is a table that defines the functionality of the PORT_A[2:0] signals and the ADDR_A[4:0] signals.

Figure 8:
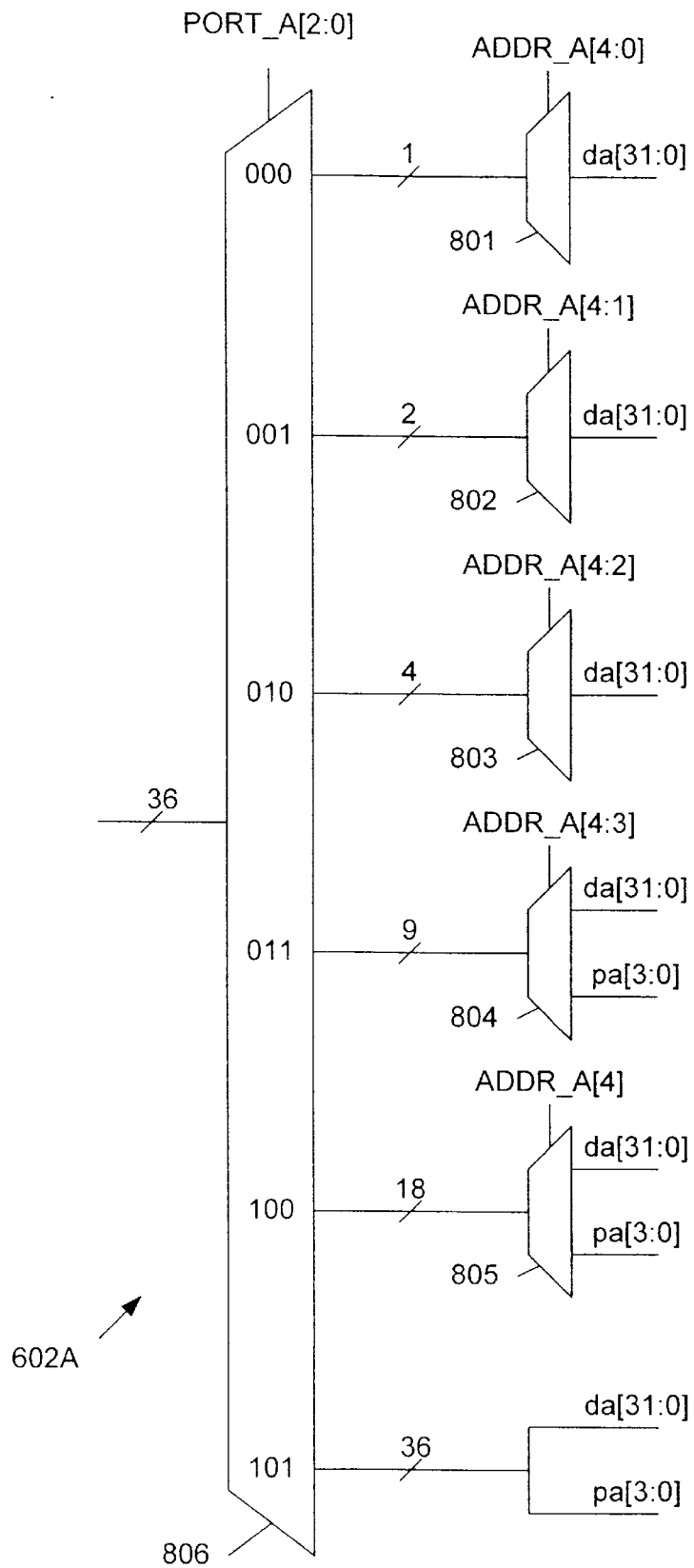
FIG. 8 is a block diagram illustrating one possible implementation of a multiplexer in a read path in accordance with one embodiment of the present invention.

FIG. 8 is a block diagram illustrating one possible implementation of multiplexer 602A. In this embodiment, multiplexer 602A includes multiplexers 801–806.

Multiplexer 801 is configured to pass one of the 32 data signals da[31:0] in response to the address signals ADDR_A[4:0]. If block RAM 200 is selected to have a word width of 1-bit, then the PORT_A[2:0] signals are selected to have a value of "000", thereby causing multiplexer 806 to route the 1-bit data value provided by multiplexer 801 on the output line of the least significant bit.

Multiplexer 802 is configured to pass two of the 32 data signals da[31:0] in response to the address signals ADDR_A[4:1]. If block RAM 200 is selected to have a word width of 2-bits, then the PORT_A[2:0] signals are selected to have a value of "001", thereby causing multiplexer 806 to route the 2-bit data value provided by multiplexer 802 on the two least significant output lines.

Multiplexer 803 is configured to pass four of the 32 data signals da[31:0] in response to the address signals ADDR_A[4:2]. If block RAM 200 is selected to have a word width of 4-bits, then the PORT_A[2:0] signals are selected to have a value of "010", thereby causing multiplexer 806 to route the 4-bit data value provided by multiplexer 803 on the four least significant output lines.

Multiplexer 804 is configured to pass eight of the 32 data signals da[31:0] and one of the 4 parity signals pa[3:0] in response to the address signals ADDR_A[4:3]. If block RAM 200 is selected to have a word width of 9-bits, then the PORT_A[2:0] signals are selected to have a value of "011", thereby causing multiplexer 806 to route the 8-bit value provided by multiplexer 804 on the eight least significant data output lines and the 1-bit parity value on the least significant parity output line.

Multiplexer 805 is configured to pass 16 of the 32 data signals da[31:0] and two of the 4 parity signals pa[3:0] in response to the address signal ADDR_A[4]. If block RAM 200 is selected to have a word width of 18-bits, then the PORT_A[2:0] signals are selected to have a value of "100", thereby causing multiplexer 806 to route the 16-bit value provided by multiplexer 805 on the 16 least significant data output lines and the 2-bit parity value on the two least significant parity output lines.

All 32 data signals da[31:0] and 4 parity signals pa[3:0] are provided to another input terminal of multiplexer 806. If block RAM 200 is selected to have a word width of 36-bits, then the PORT_A[2:0] signals are selected to have a value of "101", thereby causing multiplexer 806 to route all 32 data signals da[31:0] and 4 parity signals pa[3:0] on the 32 data output lines and the four parity output lines.

The values routed by multiplexer 602A are latched into data latch circuit 603A and provided as the read output values DOUT_A[31:0] and POUT_A[3:0].

In the foregoing manner, data values with or without associated parity bits can be read from block RAM 200.

These read operations are advantageously controlled by the PORT_A[2:0] and PORT_B[2:0] signals.

Write Path

Figure 9:
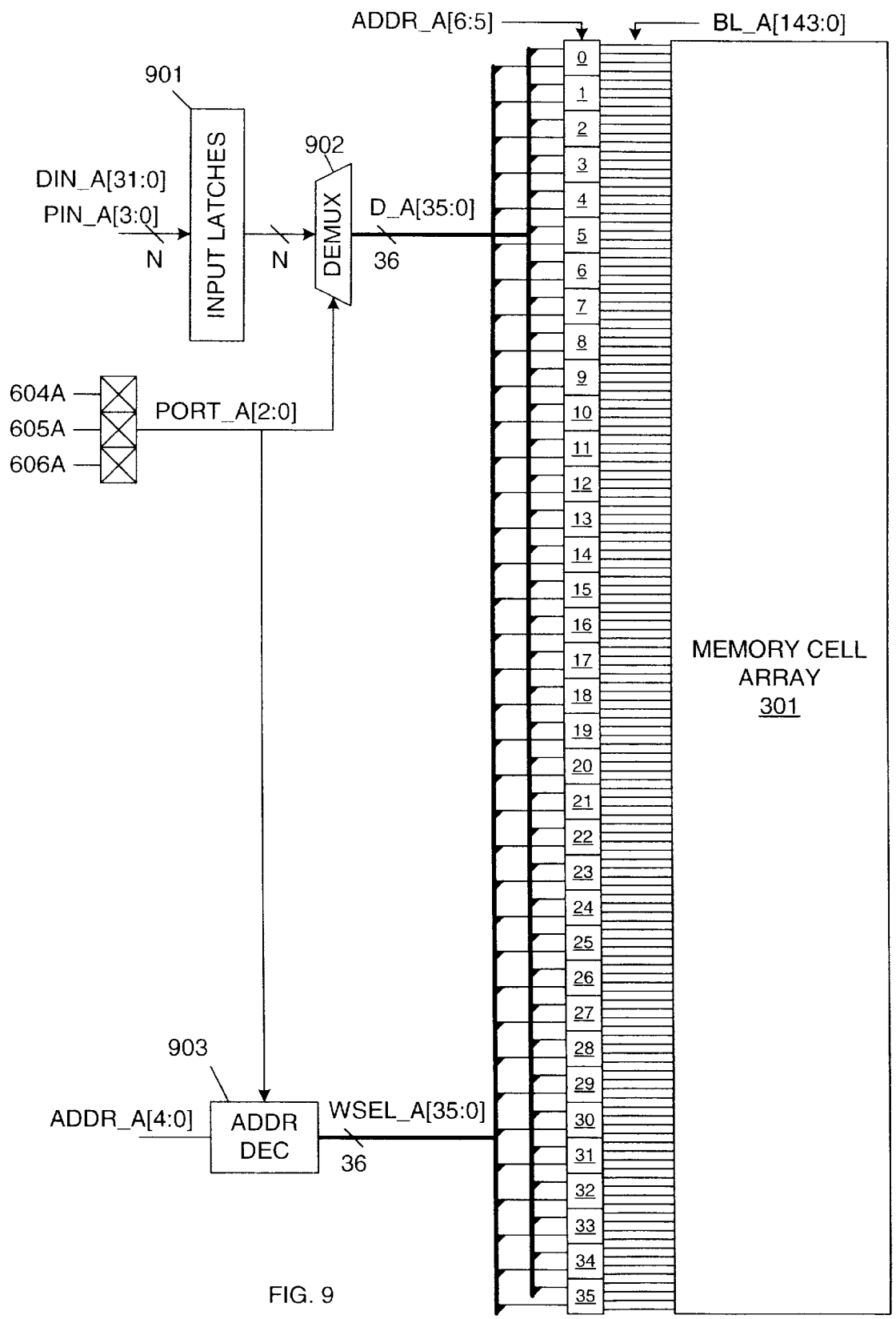
FIG. 9 is a block diagram illustrating a write path of the first port of the block RAM of FIG. 4 in accordance with one embodiment of the present invention.

FIG. 9 is a block diagram illustrating the write path of the first port 200A of block RAM 200. This write path is present in data I/O circuit 304 (FIG. 3). The write path of the second port 200B of block RAM 200 is identical to the write path of the first port 200A. The write path of the first port 200A of block RAM 200 includes input latch circuit 901, de-multiplexer 902, address decoder 903 and write control circuits 0–35. A portion of one of the write control circuits 0–35 is described above in I/O block 451 (FIG. 4). The input data values DIN_A[31:0] and the input parity values PIN_A[3:0] (if used) are latched into input latch circuit 901 and provided to de-multiplexer 902. De-multiplexer 902 routes the input values DIN_A[31:0] and PIN_A[3:0] in response to the PORT_A[2:0] signals.

FIG. 10 is a table that illustrates the manner in which de-multiplexer 902 routes the input values DIN_A[31:0] and PIN_A[3:0] to provide the input values D_A[35:0] for the six different configurations of block RAM 200. For example, to configure block RAM 200 to operate as a 9×2048 array, the PORT_A[2:0] signal is selected to have a value of "011". In response, de-multiplexer 902 routes the latched input data values DIN_A[7:0] as the input data values D_A[7:0], D_A[15:8], D_A[23:16] and D_A[31:24]. In addition, de-multiplexer 902 routes the input parity value PIN_A[0] as the input data values D_A[32], D_A[33], D_A[34] and D_A[35].

The PORT_A[2:0] signals are also provided to address decoder 903, along with address bits ADDR_A[4:0]. In response, address decoder 903 provides 36 write enable signals WSEL_A[35:0]. Each of these write enable signals WSEL_A[35:0] is provided to a corresponding one of write control circuits 0–35.

FIG. 11 is a table that illustrates the manner in which address decoder 903 generates the write enable signals WSEL_A[35:0] in response to the PORT_A[2:0] and ADDR_A[4:0] signals. For example, to configure block RAM 200 to operate as a 1×16384 array, the PORT_A[2:0] signal is selected to have a value of "000". In response, address decoder 903 asserts one of the WSEL_A[31:0] signals in response to the ADDR_A[4:0] signal. In the illustrated example, an ADDR_A[4:0] signal having a value of "001011" (a binary "5") results in the WSEL_A[5] signal being asserted at a logic "1" value. In response, the input data value D_A[5] will be written to block RAM 200.

Similarly, to configure block RAM 200 to operate as a 2×8192 array, the PORT_A[2:0] signal is selected to have a value of "001". In response, address decoder 903 asserts two of the WSEL_A[31:0] signals in response to the ADDR_A[4:1] signal. In the illustrated example, an ADDR_A[4:1] signal having a value of "0011" (a binary "3") results in the WSEL_A[7:6] signals being asserted at logic "1" values. In response, the input data values D_A[7:6] will be written to block RAM 200.

To configure block RAM 200 to operate as a 4×4096 array, the PORT_A[2:0] signal is selected to have a value of "010". In response, address decoder 903 asserts four of the WSEL_A[31:0] signals in response to the ADDR_A[4:2] signal. In the illustrated example, an ADDR_A[4:2] signal having a value of "000" (a binary "0") results in the WSEL_A[3:0] signals being asserted at logic "1" values. In response, the input data values D_A[3:0] will be written to block RAM 200.

To configure block RAM 200 to operate as a 9×2048 array, the PORT_A[2:0] signal is selected to have a value of "011". In response, address decoder 903 asserts nine of the WSEL_A[35:0] signals in response to the ADDR_A[4:3] signal. In the illustrated example, an ADDR_A[4:3] signal having a value of "10" (a binary "2") results in the WSEL_A[23:16] and WSEL_A[34] signals being asserted at logic "1" values. In response, the input data values D_A[23:16] and D_A[34] will be written to block RAM 200.

To configure block RAM 200 to operate as a 18×1024 array, the PORT_A[2:0] signal is selected to have a value of "100". In response, address decoder 903 asserts eighteen of the WSEL_A[35:0] signals in response to the ADDR_A[4] signal. In the illustrated example, an ADDR_A[4] signal having a value of "0" results in the WSEL_A[15:0] and WSEL_A[33:32] signals being asserted at logic "1" values. In response, the input data values D_A[15:0] and D_A[33:32] will be written to block RAM 200.

Finally, to configure block RAM 200 to operate as a 36×512 array, the PORT_A[2:0] signal is selected to have a value of "101". In response, address decoder 903 asserts all of the WSEL_A[35:0] signals during a write operation. In response, the input data values D_A[35:0] will all be written to block RAM 200.

Figure 12:
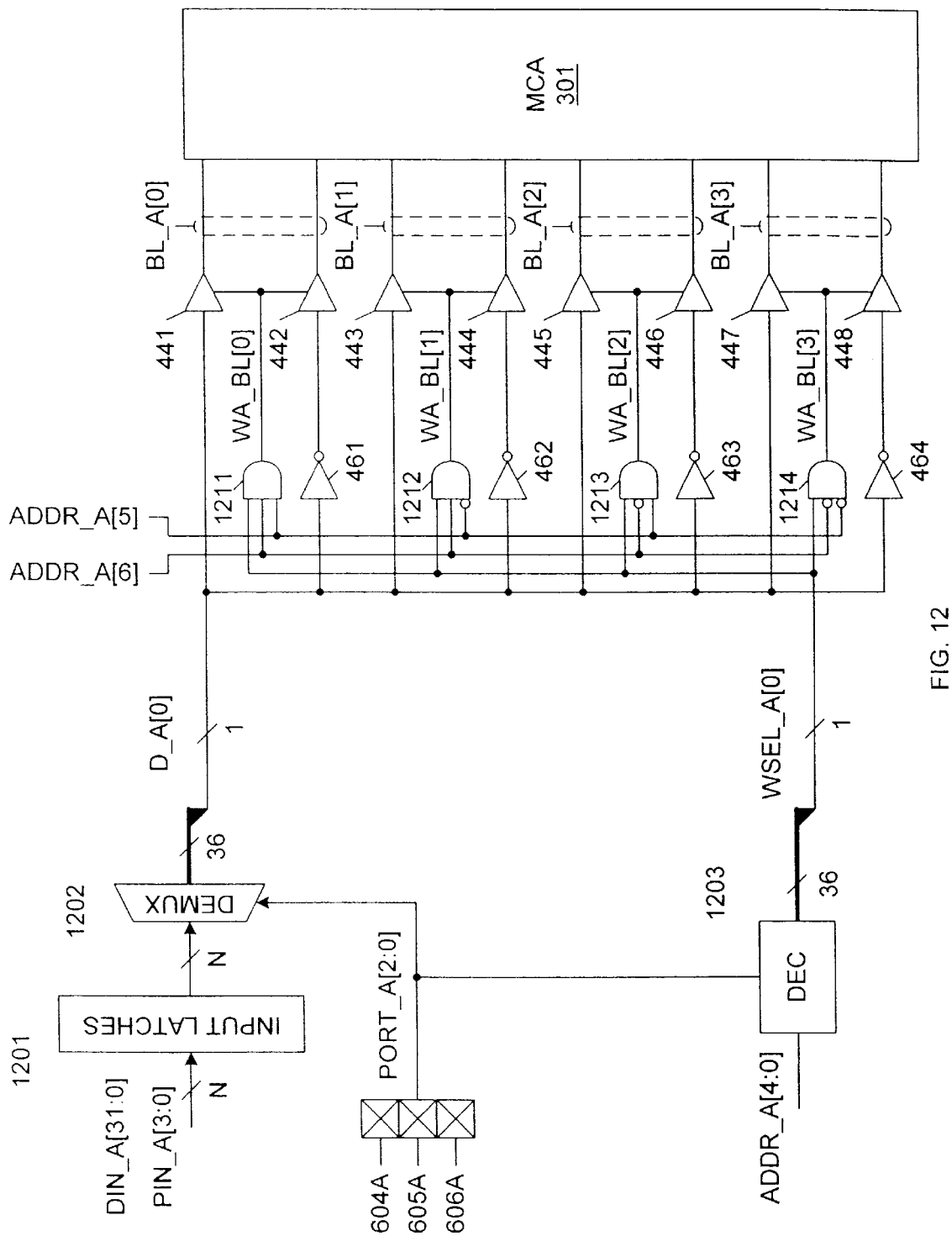
FIG. 12 is a circuit diagram that illustrates the logic of a write logic block in accordance with one embodiment of the present invention.

FIG. 12 is a circuit diagram that illustrates the logic of write logic block 0 in accordance with one embodiment of the present invention. Write logic blocks 1–35 are identical to write logic block 0. Write logic block X is coupled to receive the input data value D_A[X] and the write enable signal WSEL_A[X], where X is an integer between 0 and 35. Thus, write logic block 0 is coupled to receive the input data value D_A[0] and the write enable signal WSEL_A[0]. Write logic block 0 includes four bit line pairs BL_A[0]–BL_A[3], tri-state buffers 441–448, inverters 431–434, and 3-input AND gates 461–463.

Each of tri-state buffers 441, 443, 445 and 447 is coupled to receive the input data signal D_A[0]. Similarly, each of tri-state buffers 442, 444, 446 and 448 is coupled to receive the inverse of the input data signal D_A[0] from inverters 461, 462, 463 and 464, respectively. Each of AND gates 1211–1214 is coupled to receive the write enable signal WSEL_A[0]. The other input terminals of AND gates 1211–1214 are couple to receive unique patterns of the ADDR_A[6:5] signals. More specifically, AND gate 1211 is coupled to receive the ADDR[6:5] signals, AND gate 1212 is coupled to receive the ADDR_A[6] signal and the inverse of the ADDR_A[5] signal, AND gate 1213 is coupled to receive the inverse of the ADDR_A[6] signal and the ADDR_A[5] signal, and AND gate 1214 is coupled to receive the inverse of the ADDR_A[6:5] signals. AND gates 1211–1214 generate the write buffer enable signals WA_BL[0], WA_BL[1], WA_BL[2] and WA_BL[3], respectively. These signals are described above in connection with FIG. 4. Note that at most, one of the four bit line pairs BL_A[3:0] will be subject to a write operation at any given time.

In the foregoing manner, data values with or without associated parity bits can be written to block RAM. These write operations are advantageously controlled by the PORT_A[2:0] signals, which can be provided by configuration memory cells of the FPGA 100.

Although the invention has been described in connection with several embodiments, it is understood that this invention is not limited to the embodiments disclosed, but is capable of various modifications which would be apparent to a person skilled in the art. For example, memory cell arrays having other dimensions can be used on other embodiments of the present invention. Moreover, the memory cell arrays can be configured to have words of other lengths in other embodiments. In addition, the memory cell array can be configurable into other numbers of configurations. In another variation, the control logic selects the parity/non-parity modes in response to user signals. Thus, the invention is limited only by the following claims.

What is claimed is:

1. A dedicated block random access memory (RAM) located on a programmable logic device, the block RAM comprising:

a memory cell array; and control logic that is programmable to operate the memory cell array in a parity mode or a non-parity mode.

2. The dedicated block RAM of claim 1, wherein the memory cell array comprises an array of multi-port memory cells, each having a first port and a second port.

3. The dedicated block RAM of claim 2, wherein the block RAM further comprises:

a first port for accessing the multi-port memory cells; and a second port for accessing the multi-port memory cells, wherein the first port is independent of the second port.

4. The dedicated block RAM of claim 3, wherein the control logic includes a first portion for selecting a parity mode or a non-parity mode for the first port, and a second portion for selecting a parity mode or a non-parity mode for the second port.

5. The dedicated block RAM of claim 4, wherein the first portion is configured to select a first parity mode for the first port and the second portion is configured to select a second parity mode for the second port.

6. The dedicated block RAM of claim 5, wherein the first parity mode is different than the second parity mode.

7. The dedicated block RAM of claim 5, wherein the first parity mode is the same as the second parity mode.

8. The dedicated block RAM of claim 4, wherein the first portion is configured to select a first non-parity mode for the first port and the second portion is configured to select a second non-parity mode for the second port.

9. The dedicated block RAM of claim 8, wherein the first non-parity mode is different than the second non-parity mode.

10. The dedicated block RAM of claim 8, wherein the first non-parity mode is the same as the second non-parity mode.

11. The dedicated block RAM of claim 4, wherein the first portion is configured to select a first parity mode for the first port and the second portion is configured to select a first non-parity mode for the second port.

12. The dedicated block RAM of claim 1, wherein the control logic includes one or more configuration memory cells that are programmable to select one or more parity modes or non-parity modes.

13. A method of operating a dedicated block random access memory (RAM) located on a programmable logic device, the method comprising the steps of:

programming one or more configuration memory cells to store one or more corresponding configuration bits;

selecting a parity mode or a non-parity mode from a plurality of predetermined parity modes and non-parity modes in response to the one or more configuration bits; and operating the block RAM in response to the selected parity mode or non-parity mode.

14. The method of claim 13, wherein the step of programming is performed during configuration of the programmable logic device.

15. The method of claim 13, wherein the block RAM is a multi-port memory having a first port and a second port, the method further comprising the steps of:

selecting a first parity or non-parity mode for the first port in response to the one or more configuration bits;

operating the first port of the block RAM in accordance with the first parity or non-parity mode;

selecting a second parity or non-parity mode for the second port in response to the one or more configuration bits; and operating the second port of the block RAM in accordance with the second parity or non-parity mode.

16. The method of claim 15, wherein the first parity or non-parity mode is different than the second parity or non-parity mode.

17. The method of claim 15, wherein the first parity or non-parity mode is the same as the second parity or non-parity mode.

18. A method of operating a dedicated block random access memory (RAM) located on a programmable logic device, the block RAM, the method comprising the steps of:

providing one or more user signals to the block RAM;

selecting a parity mode or a non-parity mode from a plurality of predetermined parity modes and non-parity parity modes in response to the one or more user signals; and operating the block RAM in response to the selected parity mode or non-parity mode.

19. The method of claim 18, wherein the block RAM is a multi-port memory having a first port and a second port, the method further comprising the steps of:

selecting a first parity or non-parity mode for the first port in response to the one or more user signals;

operating the first port of the block RAM in accordance with the first parity or non-parity mode;

selecting a second parity or non-parity mode for the second port in response to the one or more user signals; and operating the second port of the block RAM in accordance with the second parity or non-parity mode.

20. The method of claim 19, wherein the first parity or non-parity mode is different than the second parity or non-parity mode.

21. The method of claim 19, wherein the first parity or non-parity mode is the same as the second parity or non-party mode.

22. A dedicated block random access memory (RAM) located on a programmable logic device, the block RAM comprising:

a memory cell array having programmable data widths for operating the memory cell array in a parity mode or a non-parity mode; and control logic that is programmable to operate the memory cell array at a plurality of data widths.

23. The block RAM of claim 22 wherein the memory cell array has a programmable data width that is an integer multiple of 9 bits.

* * * * *